United States Patent [19]

McNulty

[11] Patent Number: 4,721,155
[45] Date of Patent: Jan. 26, 1988

[54] SAWTOOTH CARD RETAINER

[75] Inventor: Christopher T. McNulty, Terryville, Conn.

[73] Assignee: United Technologies Corporation, Hartford, Conn.

[21] Appl. No.: 860,393

[22] Filed: May 7, 1986

[51] Int. Cl.[4] .............................................. H05K 7/20
[52] U.S. Cl. ................................ 164/80.2; 165/185; 361/386; 361/415
[58] Field of Search ...................... 211/41; 174/16 HS; 357/81; 165/80, 185; 361/382–388, 415; 339/75 MP, 17 L, 17 LC, 17 LM, 17 M; 24/304, 524–526

[56] References Cited

U.S. PATENT DOCUMENTS

| | | | |
|---|---|---|---|
| 3,112,496 | 12/1963 | Dritz | 24/304 |
| 3,963,317 | 6/1976 | Eigenbrode et al. | 339/74 |
| 4,076,353 | 2/1978 | Barlow | 312/350 |
| 4,184,665 | 1/1980 | Queen, Jr. | 254/104 |
| 4,196,955 | 4/1980 | Anhalt | 339/74 |
| 4,298,904 | 11/1981 | Koenig | 361/386 |
| 4,298,905 | 11/1981 | Bosler et al. | 361/386 |
| 4,314,736 | 2/1982 | Demnianiuk | 339/74 |
| 4,318,157 | 3/1982 | Rank et al. | 361/386 |
| 4,414,605 | 11/1983 | Chino et al. | 361/388 |
| 4,461,522 | 7/1984 | Bakermans et al. | 339/17 |
| 4,480,287 | 10/1984 | Jensen | 361/388 |
| 4,550,836 | 11/1985 | Ellis | 211/41 |
| 4,621,304 | 11/1986 | Oogaki | 361/386 |

FOREIGN PATENT DOCUMENTS

| | | | |
|---|---|---|---|
| 2516006 | 11/1975 | Fed. Rep. of Germany | 361/387 |
| 2103020 | 2/1983 | United Kingdom | 361/386 |

OTHER PUBLICATIONS

IBM Tech Discl Bull., vol. 14, No. 1, Jun. 1971, pp. 182, "Eternal Module Heat Sink . . . Board", Cunavelist Ing.

*Primary Examiner*—G. P. Tolin
*Attorney, Agent, or Firm*—Francis J. Maguire, Jr.

[57] ABSTRACT

A printed circuit board heat sink retainer is disclosed comprising a mating pair of sawtoothed bars with slidably engaging teeth. The bars are laterally spread apart and held by a forcing device, which may be a screw or a spring, in order to push against and hold a heat sink in a channel. The distance between successive teeth may be constant in both bars or may be constant in one bar and may decrease in a direction toward the forcing device in the second bar.

1 Claim, 15 Drawing Figures

U.S. Patent  Jan. 26, 1988  Sheet 1 of 2  4,721,155
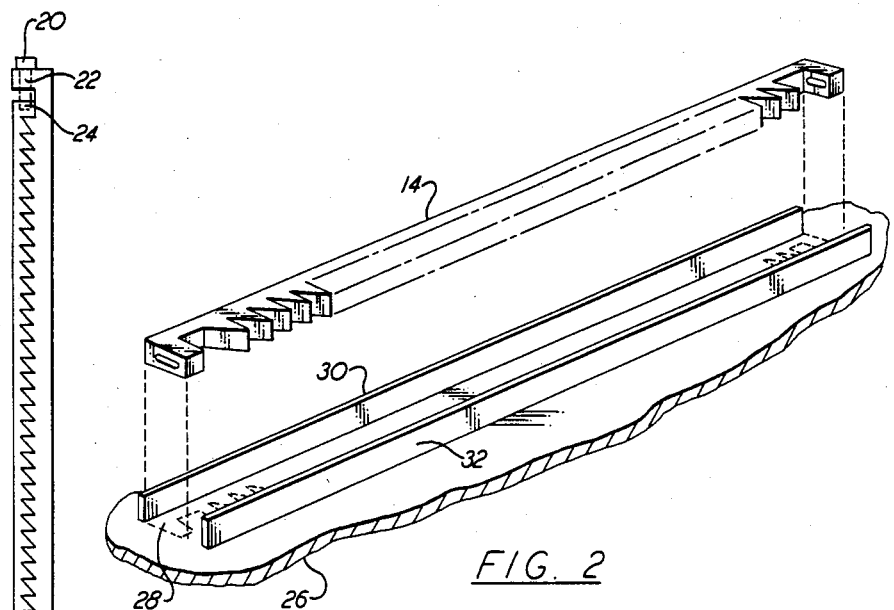
FIG. 2
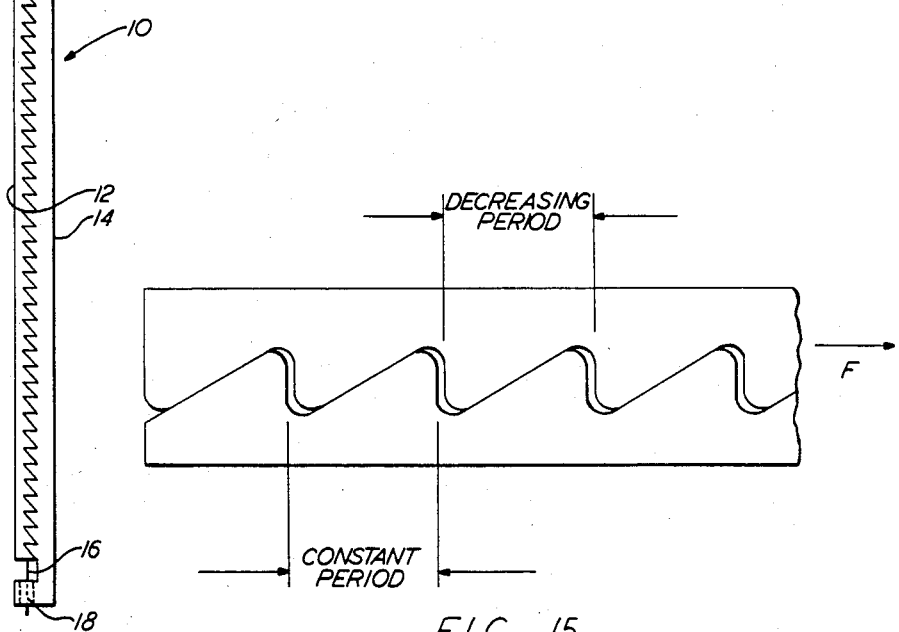
FIG. 15
FIG. 1

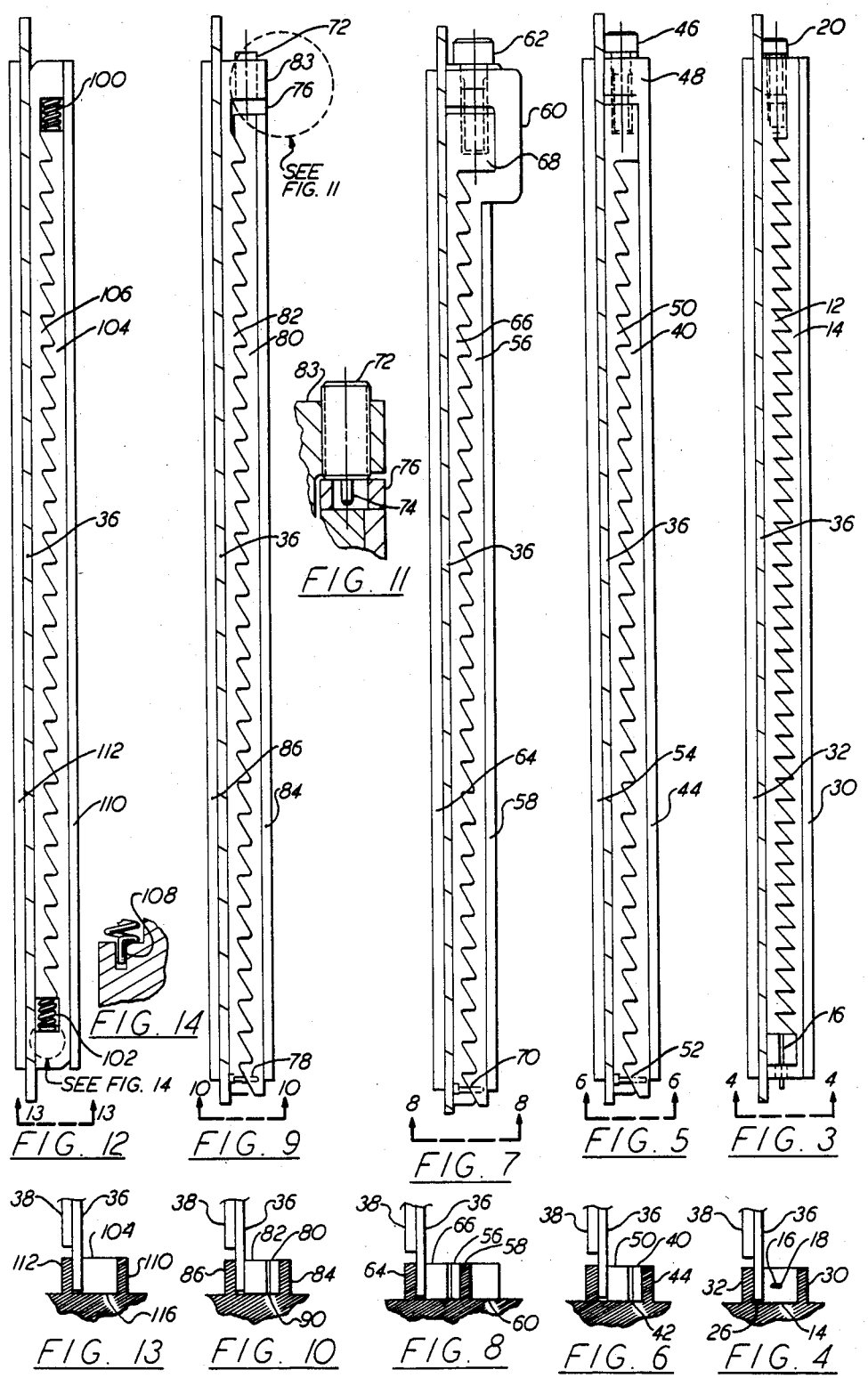

SAWTOOTH CARD RETAINER

TECHNICAL FIELD

This invention relates to electronic packaging, and particularly toward electronic printed circuit board heat sink retainers.

BACKGROUND ART

Various methods have been devised for providing effective means for conducting heat from a printed circuit board heat sink mounted in a chassis to the chassis walls. These include multi-wedge card retainers such as disclosed in U.S. Pat. Nos. 4,298,904, 4,318,157, 4,414,605, and 4,480,287. U.S. patent application Ser. Nos. 836,935 and 640,051, both assigned to the assignee of this patent also show improved multi-wedge card retainers. Such retainers have proven to be extremely useful in that they improve the heat transfer capabilities of the assembly considerably. However, they do involve somewhat high fabrication and assembly costs which it would be desirable to reduce.

DISCLOSURE OF THE INVENTION

The object of the present invention is to provide a printed circuit board heat sink retainer for retaining a heat sink in a chassis which is both less expensive than the multi-wedge method and which provides a more effective heat transfer vehicle.

According to the present invention, a printed circuit board heat sink retainer comprises a pair of toothed bars, each having a rectangular or square cross-section and each having a toothed side facing one another in a mating sawtooth pattern, the surfaces of the teeth slidingly engaging to a greater or lesser degree depending, respectively, on how close or far away the two bars are positioned. One of the bars is compliantly bonded to the internal wall of a chassis between two parallel ribs integral to the internal wall. The bonded bar is butted up as closely as possible to one of the two parallel ribs and the other bar is laid along side the bonded bar such that the teeth mate for sliding engagement of the teeth. The edge of a heat sink may be placed up against the internal wall with one of its sides up against a pushing side of the second bar and its other side up against the second rib. External forces may then be applied by means of a set screw or springs to force the two bars further apart so that the heat sink is pressed up hard against the second rib. The set screw or springs not only spread but also hold the two bars apart. Thus there is a heat transfer path from the heat sink to the second parallel rib and from the heat sink through the second bar, through the slidingly engaged teeth of the second and first bars, through the first bar to the first parallel rib and on to the chassis for further conduction.

In further accord with the present invention, the two bars may be held together, especially for the not spread apart or loose condition, by a captivating pin at one end of the two bars. This keeps the unbonded tube from falling out of the chassis when not being used as a heat sink retainer.

The sawtooth card retainer of the present invention is a design which effects heat transfer and restraint of printed circuit boards. A low production cost was considered to be an important design constraint.

The sawtooth card retainer of the present invention is designed primarily for "closed-box" or air cooled electronic equipment. In these types of electronic packages, cooling of the internal components is achieved primarily through a conduction path from the printed circuit board heat sink to the chassis. Waste heat is then transmitted via radiation, convection and conduction to the environment outside the electronic package. It may also be dissipated via cooling air which may pass through an internal heat exchanger.

Use of the sawtooth card retainer of the present invention provides a lower printed circuit board heat sink temperature than any other commercial card retainer known to the inventor. In addition, the cost of implementing the sawtooth card retainer is less than any of the other techniques now being used.

The sawtooth card retainer makes very good use of the second rib in the chassis as a means of dissipating waste heat. Additionally, the clamping forces achieved by the sawtooth card retainer provides a constant heat transfer path along the printed circuit board heat sink due to the use of both a fixed and a varying period toothed bar which when clamped will distribute the loading uniformly over the entire length of the printed circuit board heat sink. Finally, the cost to manufacture the sawtooth card retainer is much less than retainers of the prior art.

These and other objects, features and advantages of the present invention will become more apparent in light of the detailed description of a best mode embodiment thereof, as illustrated in the accompanying drawing.

BRIEF DESCRIPTION OF THE DRAWING

FIG. 1 is an illustration of an embodiment of a sawtooth card retainer, according to the present invention;

FIG. 2 is a perspective illustration of a sawtoothed bar shown elevated over the position in which it is to be compliantly bonded to an internal wall of a chassis such that it is compliantly butted against one of two parallel ribs integral to the internal wall;

FIG. 3 is an illustration of the embodiment of FIG. 1 shown inserted between the ribs of FIG. 2;

FIG. 4 is a section view of the retainer of FIG. 3 along lines 4—4 of FIG. 3;

FIG. 5 is an illustration of an embodiment of a sawtooth card retainer, according to the present invention;

FIG. 6 is a sectional illustration of the retainer of FIG. 5 along lines 6—6 of FIG. 5;

FIG. 7 is an embodiment of a sawtooth card retainer, according to the present invention;

FIG. 8 is a sectional illustration of the retainer of FIG. 7 along lines 8—8 of FIG. 7;

FIG. 9 is an illustration of an embodiment of a sawtooth card retainer, according to the present invention;

FIG. 10 is a sectional illustration of the retainer of FIG. 9 taken along lines 10—10 of FIG. 9;

FIG. 11 is a sectional illustration of the Allen Head set screw circled in FIG. 9;

FIG. 12 is an illustration of an embodiment of a sawtooth card retainer, according to the present invention;

FIG. 13 is a sectional illustration of the retainer of FIG. 12 viewed along lines 13—13 of FIG. 12;

FIG. 14 is a sectional illustration of the compression spring circled in FIG. 12; and FIG. 15 is an illustration of a bonded toothed bar with constant tooth pitch slidably engaged with a moveable toothed bar with decreasing tooth pitch, according to one aspect of the present invention.

BEST MODE FOR CARRYING OUT THE INVENTION

FIG. 1 is an illustration of an embodiment 10 of a sawtooth card retainer, according to the present invention. The illustrated embodiment is made up of two elongated pieces 12, 14 each having a sawtooth pattern which mates with the sawtooth pattern of the other piece. The two pieces' sawtooth patterns slidably engage one another such that they can be very close together as shown in FIG. 1 or can be spread apart while still maintaining sliding engagement of the teeth. A captivating pin 16 attached to piece 12 is free to move within a slot 18 of piece 14 but is not permitted to leave the slot 18. Piece 14 has a socket head screw 20 captivated in a slot 22 at the end of piece 14 opposite from the end with the captivating pin. The threaded end of the cap screw 2 engages a threaded hole 24 in piece 12. The slot 22 is oriented such that the screw 20 can move in the slot 22, laterally on the drawing, with lateral and horizontal movement of piece 12 with respect to piece 14.

FIG. 2 is a perspective illustration of piece 14 of FIG. 1 elevated above an internal wall 26 of an electronic chassis. Piece 14 is elevated above the position in which it is to be compliantly bonded to the internal wall 26 using silicone or acrylic adhesive. A dotted line outline 28 of piece 14 is illustrated. Piece 14 is bonded so that it is butted up against a first rib 30 integral to the internal wall 26. A second, parallel rib 32 completes the formation of a U-shaped cross-section channel within which the sawtooth retainer of the present invention will reside, along with a printed circuit board heat sink, as is more fully illustrated in FIGS. 3 and 4.

FIG. 3 is an illustration of the type of retainer embodiment as shown in FIG. 1 mounted between the parallel ribs 30, 32 of FIG. 2. Piece 14 has been bonded to the internal wall 26 and is butted up against rib 30. Piece 14 is free to move slightly to the extent permitted by the resiliency inherent in the bonding material utilized. Piece 12 is not bonded and is free to move with respect to piece 14 by sliding engagement of the teeth.

A heat sink 36 is shown sectionally inserted between piece 12 and rib 32. A section view along lines 4—4 is presented in FIG. 4. The section view shows the heat sink 36 butted up against rib 32 by virtue of forces applied by the sawtooth card retainer embodiment 10. A printed circuit board 38 is shown attached to the heat sink 36 and contains a plurality of electronic components which conduct heat to the heat sink for conduction to the chassis wall 26.

Referring back to FIG. 3, the screw 20 may be threaded into piece 12 to spread the two pieces 12, 14 of the sawtooth card retainer further apart in order to exert force required to provide a heat conduction path from the heat sink to rib 32 and from the heat sink to rib 30 through pieces 12 and 14 via the slidingly engaged teeth. Since piece 14 is only compliantly, or resiliently, bonded to internal wall 26, there will be movement of piece 14 such that piece 14 can be forced up tighter against rib 30 depending on the degree of force exerted by the screw acting through piece 14 into piece 12.

Returning to FIG. 1, the sawtooth card retainer illustrated consists of two machined, rolled or extruded pieces 12, 14 in the form of elongated bars having a four-sided end view with right angled corners. Each bar has a sawtooth pattern on one side that mates with and slidingly engages the teeth of the other bar. The card retainer is mounted as shown in FIGS. 2, 3 and 4 to the internal wall of an electronic chassis between two parallel ribs. The card retainer is operated by applying torque to a socket head cap screw or other similar device. As the screw is torqued, the card retainer expands causing the heat sink to be clamped between the opposing ribs. The set screw is torqued in a manner which causes a pulling upwardly, in the direction from bottom to top of the sheet of FIG. 3, on the piece 12. In other words, if the screw 20 of FIG. 3 has a right-handed thread, it will be necessary to turn the screw in a clockwise direction in order to cause expansion of pieces 12 and 14.

The tooth angle illustrated in FIGS. 1 and 3 is 45°. The tooth angle may be changed to a wide variety of possible different angles but a choice of 30° was made in the embodiments of FIGS. 5, 7, 9 and 12 in order to decrease the number of teeth required from the large number shown in FIG. 3.

FIG. 5 is an illustration of an embodiment of a sawtooth card retainer, according to the present invention. A first piece 40 is bonded to the internal wall 42 of the chassis, as shown in FIG. 6. Referring back to FIG. 5, the bonded piece 40 butts up against a rib 44 which has a screw 46 inserted and captivated in a slotted end 48. The screw 46 is threaded and screwed into one end of a second saw-tooth piece 50. Piece 40 contains a captivating pin 52 that is fixed at the end opposite the screw. Piece 50 contains a slot to accomodate pin 52 and allows the sawtooth bars to slidably engage the printed circuit board heat sink.

A printed circuit board heat sink 36 may be inserted between piece 50 and a second rib 54 for being retained. In that event, screw 46, if it is of the right-handed thread variety, may be turned in the clockwise direction in order to spread apart pieces 40 and 50 thereby compressing the heat sink 36 up against rib 54 and providing a heat transfer path similar to that described in connection with FIG. 3. The main difference between the embodiement of the card retainer of FIG. 5 and that of FIG. 3 is that the screw is held in a slot which is part of rib 44 instead of part of piece 14, as in FIG. 3. This is a matter of design choice.

FIG. 6 is a section view taken along lines 6—6 of FIG. 5 and shows the various pieces of FIG. 5 from a bottom view and also shows a printed circuit board 38 mounted on the heat sink 36.

FIG. 7 is another embodiment of the sawtooth card retainer, according to the present invention. In this case, a first piece 56 is bonded against a first rib 58 and the first piece 56 has an oversized end portion 60 for providing a slot for captivating an oversized screw 62. The rib 58 is not as long as a corresponding rib 64 so that the oversized end 60 can extend outward from the confines of the U-shaped channel.

A second piece 66 has a threaded end 68 for receiving the threaded end of the screw 62. The cap screw may be rotated in a clockwise direction, assuming a right-handed thread, and the two pieces 56, 66 will spread apart and press a heat sink 36 against rib 64 in a manner similar to that described in connection with FIGS. 3 and 5. A captivating pin 70 holds the two pieces 56, 66 together in case the screw is loosened and the heat sink is removed.

FIG. 8 is a section view taken along lines 8—8 of FIG. 7 showing a top view of the ribs 58, 64 and many of the other numbered pieces of FIG. 7.

FIG. 9 is an embodiment of a sawtooth card retainer, according to the present invention. This particular embodiment utilizes an Allen Head set screw 72 for mechanizing the card retainer. Referring to FIG. 11, the set screw 72 has a captivating pin 74 mounted through its centerline that mates to a slotted steel bearing plate 76.

Referring back to FIG. 9, the retainer is held captive by a second captivating pin 78 at the opposite end of the retainer. This holds the two pieces 80, 82 together in the event that the Allen screw is loosened and the heat sink removed.

It will be observed that the second piece 82, closest to the heat sink 36, has an oversized end 83 which contains the Allen Head set screw. Assuming a right-hand thread, if the screw is rotated in a clockwise direction as viewed from the top of FIG. 9, piece 82 will be pulled upwardly and heat sink 36 will be pushed up against rib 86 and piece 80 up against rib 84 to the extent that its resilient bonding permits.

FIG. 10 is a section view along lines 10—10 of FIG. 9 showing a bottom view of the heat sink 36, the attached printed circuit board 38, ribs 84, 86, pieces 80, 82 and the internal wall 90 upon which piece 80 is resiliently bonded as is similarly illustrated in FIG. 2 for the case of the embodiment of FIG. 1.

FIG. 12 is an embodiment of a sawtooth card retainer, according to the present invention. This particular embodiment does not use any set screw for external torquing. Instead, it uses a pair of compression springs 100, 102 for both retaining the two pieces 104, 106 in the absence of a heat sink 36 and also for keeping pressure against the heat sink in the absence of any positive torquing action required by a technician. i.e., in this embodiment there is no need for a technician to provide any torquing action to retain the heat sink. This is advantageous for those cases in which the technician forgets to torque down a particular card. It is also a labor saving device in that it takes a lot of time for a technician to torque down many different retainers in a chassis. This applies both during initial assembly and during routine maintenance. The structure of the embodiment of FIG. 12 is also advantageous from the point of view of both pieces 104 and 106 are identical and interchangable. Thus, assembly complexity and cost are reduced by providing only one type of extrusion, etc. The manner in which the spring is held into piece 104 is shown in FIG. 14. The spring has an end 108 which is bonded into a cylindrical cavity in piece 104. A similar technique is used for the other spring 100 for bonding its end into piece 106. The other end of each spring may also be fastened or bonded to the other piece so that the two pieces 104, 106 do not become separated when the heat sink 36 is removed from between the ribs 110, 112. In the embodiment of FIG. 12 piece 104 is bonded to internal wall 116 as shown in FIG. 13.

In the embodiments illustrated in FIGS. 3, 5, 7 and 9, the period between teeth on the bonded sawtooth pattern pieces 14, 40, 56 and 80, respectively, is the same. On the mating extrusion, 12, 50, 66 and 82, the period is decreased slightly from tooth to tooth as one progresses from the bottom of the sheet toward the top where the screw is located. This is shown in FIG. 15 is more detail where a decreasing period is shown in the top piece (the moveable piece) and a constant period is shown in the bonded piece at the bottom. The force directional arrow (F) points toward the set screw, where the pulling force originates. The result is that the teeth mate farthest from the screw first and progressively mate as the screw is tightened. This leads to a more constant load distribution and helps to address thermal gradients along the length of the card retainer.

The spring loaded embodiment of FIG. 12 uses forcing devices acting at opposite ends. This eliminates any need to have a constant and variable pitch sawtooth bar to equalize the load distribution on the heat sink. i.e., the use of a variable with a constant pitch sawtooth pattern was used only where the forcing device acted at only one end.

Although the invention has been shown and described with respect to a best mode embodiment thereof, it should be understood by those skilled in the art that the foregoing and various other changes, omissions, and additions inthe form and detail thereof may be made therein without departing from the spirit and scope of the invention.

I claim:

1. A printed circuit board heat sink retainer, comprising:
    a first sawtoothed piece bonded to an internal chassis wall between a pair of ribs integral to said wall and butted up against one of the ribs, wherein the distance between successive teeth is constant;
    a second sawtoothed piece loosely held between the ribs for mating its sawteeth with the teeth of the first piece, wherein the distance between successive teeth decreases in the direction of a spread apart and hold force; and
    spread apart and hold means, for providing said spread apart and hold force for spreading and holding said first and second pieces apart such that the second piece pushes against a heat sink inserted between it and a rib.

* * * * *